(12) United States Patent
Konmoto

(10) Patent No.: US 7,734,433 B2
(45) Date of Patent: Jun. 8, 2010

(54) SEMICONDUCTOR INTEGRATED CIRCUIT

(75) Inventor: Akihiko Konmoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/016,038

(22) Filed: Jan. 17, 2008

(65) Prior Publication Data

US 2008/0191747 A1   Aug. 14, 2008

(30) Foreign Application Priority Data

Feb. 14, 2007   (JP) .............................. 2007-033971

(51) Int. Cl.
*G01R 13/22* (2006.01)
(52) U.S. Cl. ........................... 702/64; 702/69; 702/125; 702/182
(58) Field of Classification Search .................. 702/58, 702/59, 64, 69, 182–185, 188; 324/613, 324/763; 326/38; 327/565; 714/724; 365/233
See application file for complete search history.

(56) References Cited

U.S. PATENT DOCUMENTS

| 6,823,293 | B2  |   | 11/2004 | Chen et al. |   |
|---|---|---|---|---|---|
| 7,116,114 | B2 | * | 10/2006 | Kajita | ......................... 324/613 |
| 7,304,910 | B1 | * | 12/2007 | Hanzawa et al. | ........ 365/233.18 |
| 7,355,429 | B2 | * | 4/2008 | Jenkins et al. | ............... 324/763 |
| 7,359,811 | B1 | * | 4/2008 | Liu | .............................. 702/69 |
| 7,443,187 | B2 | * | 10/2008 | Jenkins et al. | ............... 324/763 |

FOREIGN PATENT DOCUMENTS

| JP | 2002-091789 A | 3/2002 |
|---|---|---|
| JP | 2004-212387 A | 7/2004 |

* cited by examiner

*Primary Examiner*—Carol S Tsai
*Assistant Examiner*—Felix E Suarez
(74) *Attorney, Agent, or Firm*—Arent Fox LLP

(57) ABSTRACT

A semiconductor integrated circuit includes a first power source having a power supply voltage that operates the semiconductor integrated circuit, a voltage comparator that compares the power supply voltage with a reference voltage, and a comparison result recording unit that records a comparison result of the voltage comparator, wherein the comparison result recording unit records a length of a period based on a clock signal for which the power supply voltage exceeds the reference voltage.

8 Claims, 11 Drawing Sheets

US 7,734,433 B2

SEMICONDUCTOR INTEGRATED CIRCUIT

CROSS-REFERENCE TO RELATED APPLICATIONS

This application is based upon and claims the benefit of priority from Japanese Patent Application No. 2007-033971, filed on Feb. 14, 2007, the entire contents of which are incorporated herein by reference.

BACKGROUND

The present disclosure relates to a semiconductor integrated circuit that can observe power source noise containing high frequency components without enlarging the scale of the circuit.

In connection with progression of microfabrication in a manufacturing process of semiconductor integrated circuits, power source noise has recently had a more significant impact on the operation of semiconductor integrated circuits, and it has been important to take an accurate countermeasure. In order to take a countermeasure to the power source noise, it is important to observe the power source noise accurately.

A method of connecting an oscilloscope to a semiconductor integrated circuit or an electronic board having a semiconductor integrated circuit mounted thereon and observing power source noise has been generally used as a method of observing power source noise. Furthermore, JP-A-2004-212387 has proposed a technique of mounting a noise analyzer unit on a semiconductor integrated circuit in an on-chip style and observing power source noise.

In addition to progression of the microstructure of semiconductor integrated circuits, the operation speed has been increased and CPU (Central Processing Unit) operates at a high speed of 1 GHz or more, for example. High-frequency power source noise occurs in such a semiconductor integrating circuit operating at a high speed, however, it is difficult to observe the high-frequency power source noise by connecting an oscilloscope to the outside of the semiconductor integrated circuit because the power source noise is easily attenuated.

On the other hand, according to the technique in which a circuit for observing power source noise is mounted on the semiconductor integrated circuit in the on-chip style, as proposed in the above publication, observation of power source noise in the neighborhood of a noise generating source can be enabled, and thus, the high-frequency power source noise can be easily observed. However, the technique proposed in the above publication has a problem that the cost of the semiconductor integrated circuit increases because many circuits, such as a storage unit for storing noise data, etc., are mounted on the semiconductor integrated circuit.

Embodiments of the present disclosure have been implemented in view of the foregoing problem of the related art, and have an object to provide a semiconductor integrated circuit that enables observation of power source noise containing high-frequency components without enlarging the scale of the circuit.

SUMMARY

To solve the above-identified issue, a semiconductor integrated circuit of this disclosure including a first power source having a power supply voltage for operating the semiconductor circuit, a voltage comparator for comparing the power supply voltage with a predetermined reference voltage, and a comparison result recording unit for recording a comparison result of the voltage comparator, wherein the comparison result recording unit records the length of a period for which the power supply voltage exceeds the reference voltage.

The semiconductor integrated circuit may further include a clock controller for expanding the width of a pulse constituting the clock signal.

Further, the voltage comparator may be operated by a second power source, which is different from the first power source, supplied from a system different from that of the first power source.

The semiconductor integrated circuit may further include a power supply stabilizing unit for stabilizing the power supplied to the voltage comparator.

Further, the voltage comparator may change a voltage value of the reference voltage by a variable resistor.

Furthermore, in the semiconductor integrated circuit, the reference voltage may be supplied externally.

Further, the voltage comparator may have a selector for selecting a power source as a comparison target.

DETAILED DESCRIPTION OF THE EMBODIMENTS

In the following descriptions, many of the exemplary circuits are shown to include n-channel metal-oxide-semiconductor field-effect transistors (MOSFETs) in a variety of configurations. While MOSFET devices are used by example, the disclosed circuits may be implemented using any number of other transistor types, such as J-FETs, bipolar transistors, and so on. Additionally, while n-channel devices are used in the following examples, the same general approaches may also apply to circuits incorporating p-channel FETs or PNP bipolar transistors, for example.

Still further, while terms "drain" and "source" are used for ease of explanation and to adhere to traditional engineering usage, it should be recognized that a drain and source of a FET transistor may be considered interchangeable, and for the following descriptions merely thought of as a first end and a second end of a semiconductor channel unless otherwise stated or apparent to one of ordinary skill in the art.

Preferred embodiments of a semiconductor integrated circuit will be described herein with reference to the accompanying drawings.

Figure 10:
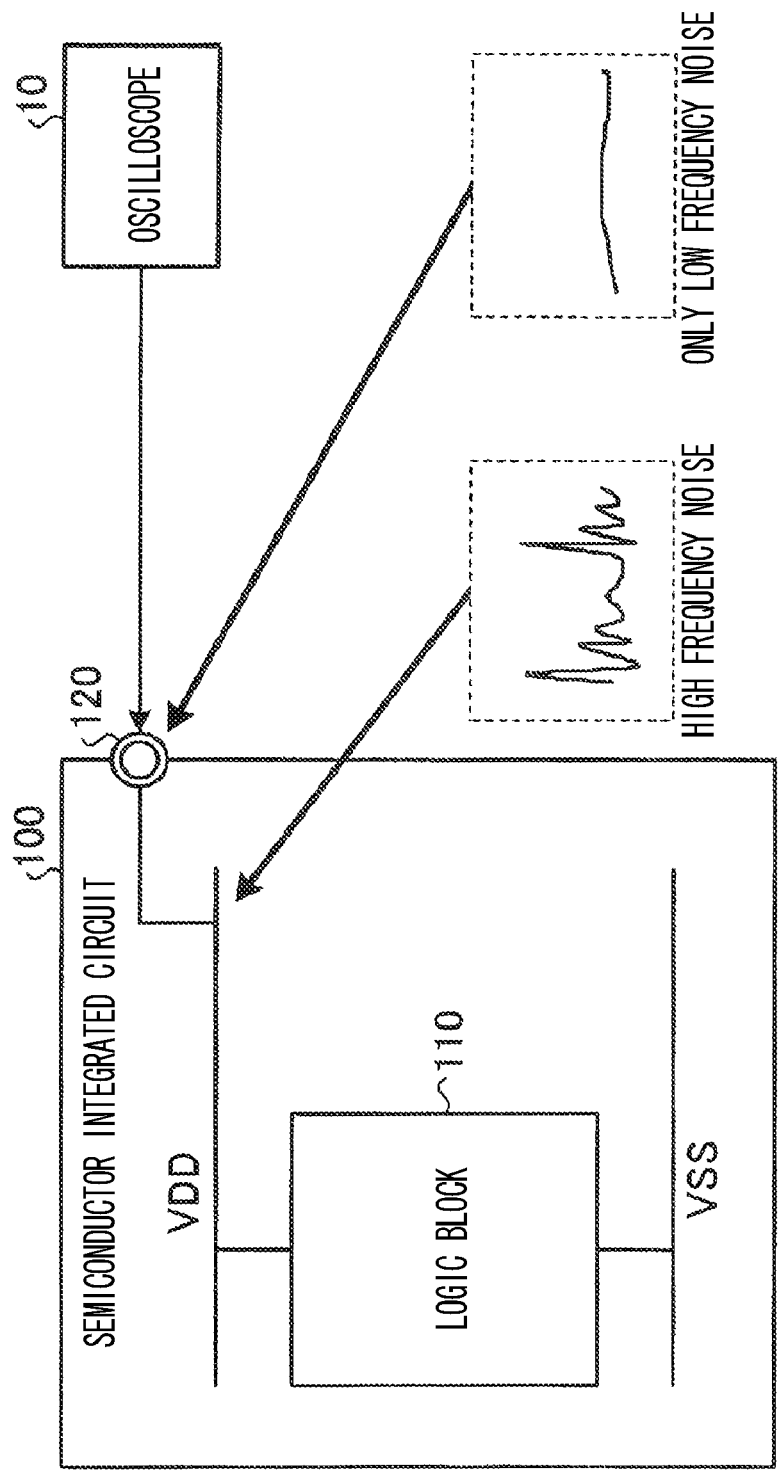
FIG. 10 is a diagram showing a noise observing method.

First, a method of observing power source noise by using an oscilloscope will be described. FIG. 10 is a diagram showing a noise observing method. As shown in FIG. 10, a semiconductor integrated circuit 100 has a logic block 110. The logic block 110 is a circuit block for executing high-speed arithmetic processing, and it is supplied with two power sources of VDD and VSS to be operated.

Since the logic block 110 operates at a high speed, and thus high-frequency noise occur in the power sources for the logic block 110, VDD and VSS. In the example of FIG. 10, in order to observe noise attributed by VDD, a monitor terminal 120 is provided to the semiconductor integrated circuit 100 and VDD is drawn out to the monitor terminal 120.

In the example of FIG. 10, the noise of VDD can be observed by connecting an oscilloscope 10 to the monitor terminal 120. However, the high-frequency component of the noise is attenuated on a passage through which VDD is drawn out to the monitor terminal 120, so that only the low-frequency noise is observed. Furthermore, wires for drawing out VDD and VSS used for this method operate as antennas, which may be susceptible to noise.

Figure 11:
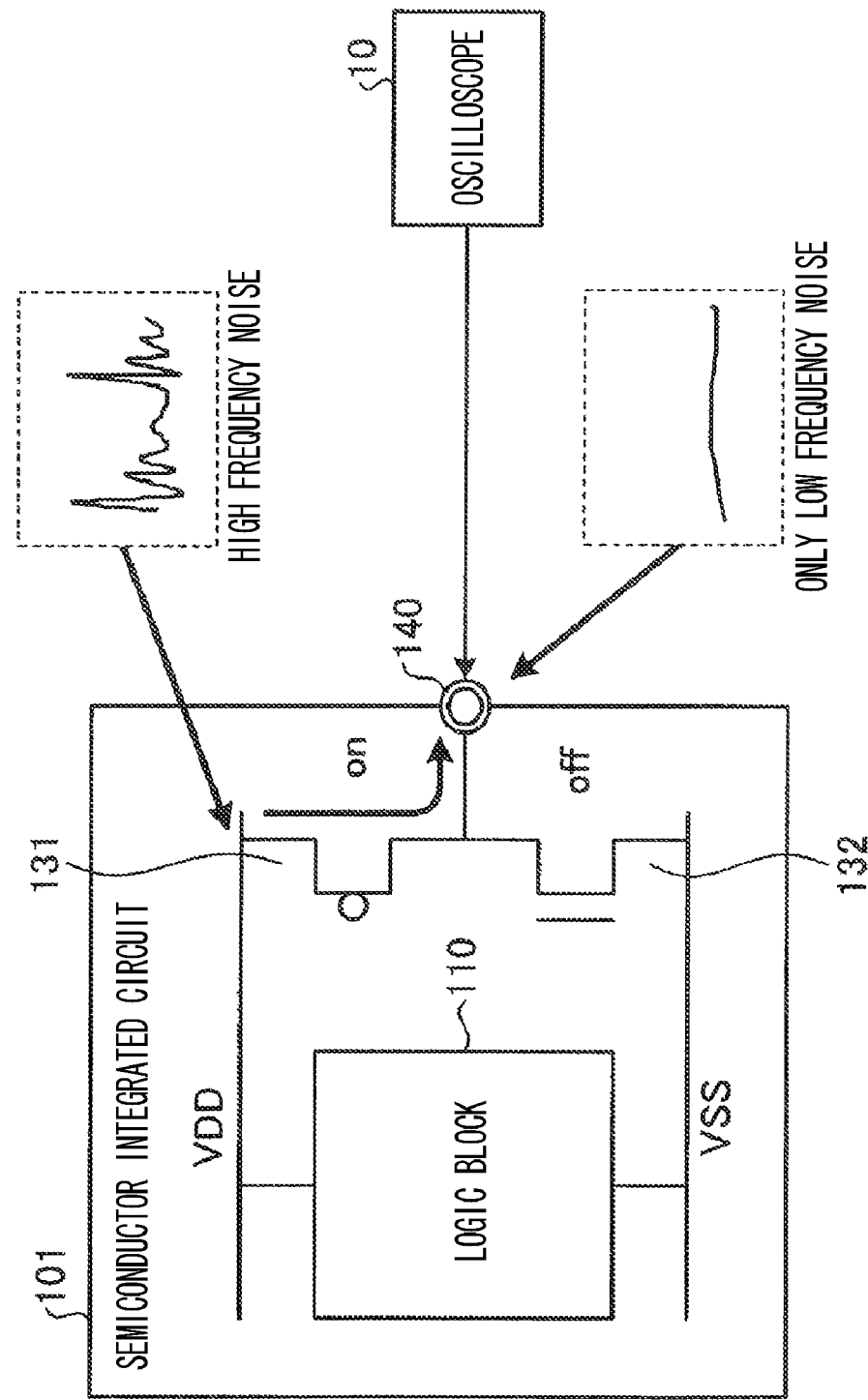
FIG. 11 is a diagram showing another noise observing method.

FIG. 11 is a diagram showing another noise observing method. As shown in FIG. 11, a semiconductor integrated circuit 101 does not have any terminal dedicated to observation of power source noise which corresponds to the monitor terminal 120. Even when the terminal dedicated to the observation of the power source noise is not provided, noise attributed by VDD can be observed by turning on only PMOS 131 among PMOS 131 and NMOS 132 of I/O and connecting an oscilloscope 10 to an input/output terminal 140.

However, even in the case of the method of FIG. 11, the power source noise is observed through the ON-resistance of I/O. As the ON-resistance and the capacitance of I/O are large, the high-frequency component of the noise is attenuated and thus only the low-frequency noise can be observed.

As described above, in the method of observing noise by connecting the oscilloscope 10 to the outside of the semiconductor integrated circuit, the high-frequency noise is attenuated before it reaches the oscilloscope, and thus is not observed. Therefore, according to a power source noise observing method of this embodiment, a mechanism for observing noise is provided inside the semiconductor integrated circuit.

Figure 1:
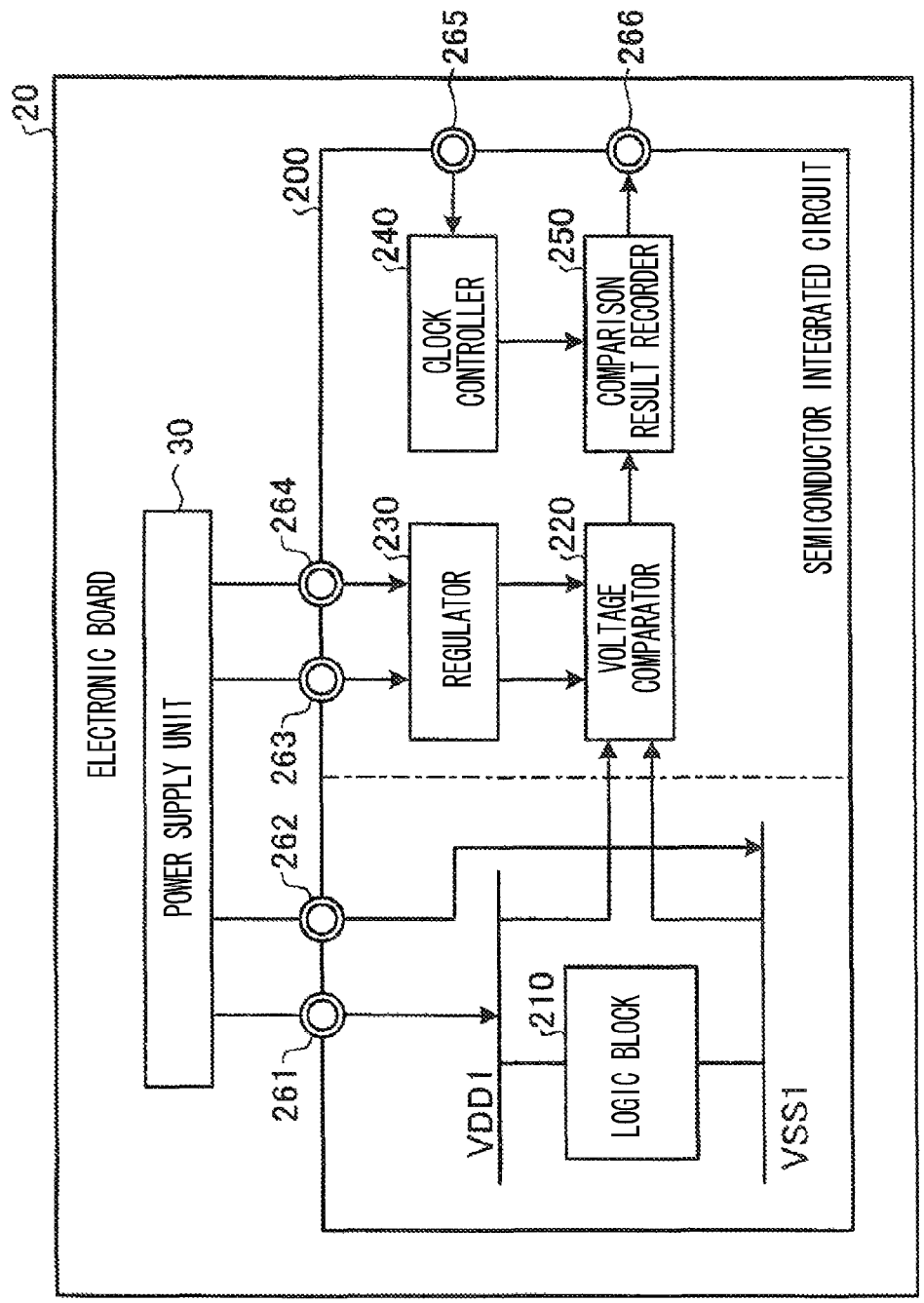
FIG. 1 is a block diagram showing a structure of a semiconductor integrated circuit according to a first embodiment.

Next, a construction of a semiconductor integrated circuit for implementing a power source noise observing method according to this embodiment will be described. FIG. 1 is a block diagram showing a construction of a semiconductor integrated circuit 200 according to this embodiment. As shown in FIG. 1, a semiconductor integrated circuit 200 has a logic block 210, a voltage comparator 220, a regulator 230, a clock controller 240 and a comparison result recorder 250.

The semiconductor integrated circuit 200 is mounted on an electronic board 20, and supplied with power from a power supply unit 30 mounted on an electronic board 20. The respective parts of the semiconductor integrated circuit 200 will be described in detail.

The logic block 210 is a circuit block for executing high-speed arithmetic processing, and it is supplied with two power sources of VDD1 and VSS1 to be operated. VDD1 and VSS1 are supplied from a power supply unit 30 through power supply terminals 261 and 262.

A voltage comparator 220 is a circuit for comparing one of VDD1 and VSS1 with a reference voltage (Vref) and outputting a comparison result to a comparison result recorder 250.

Figure 2:
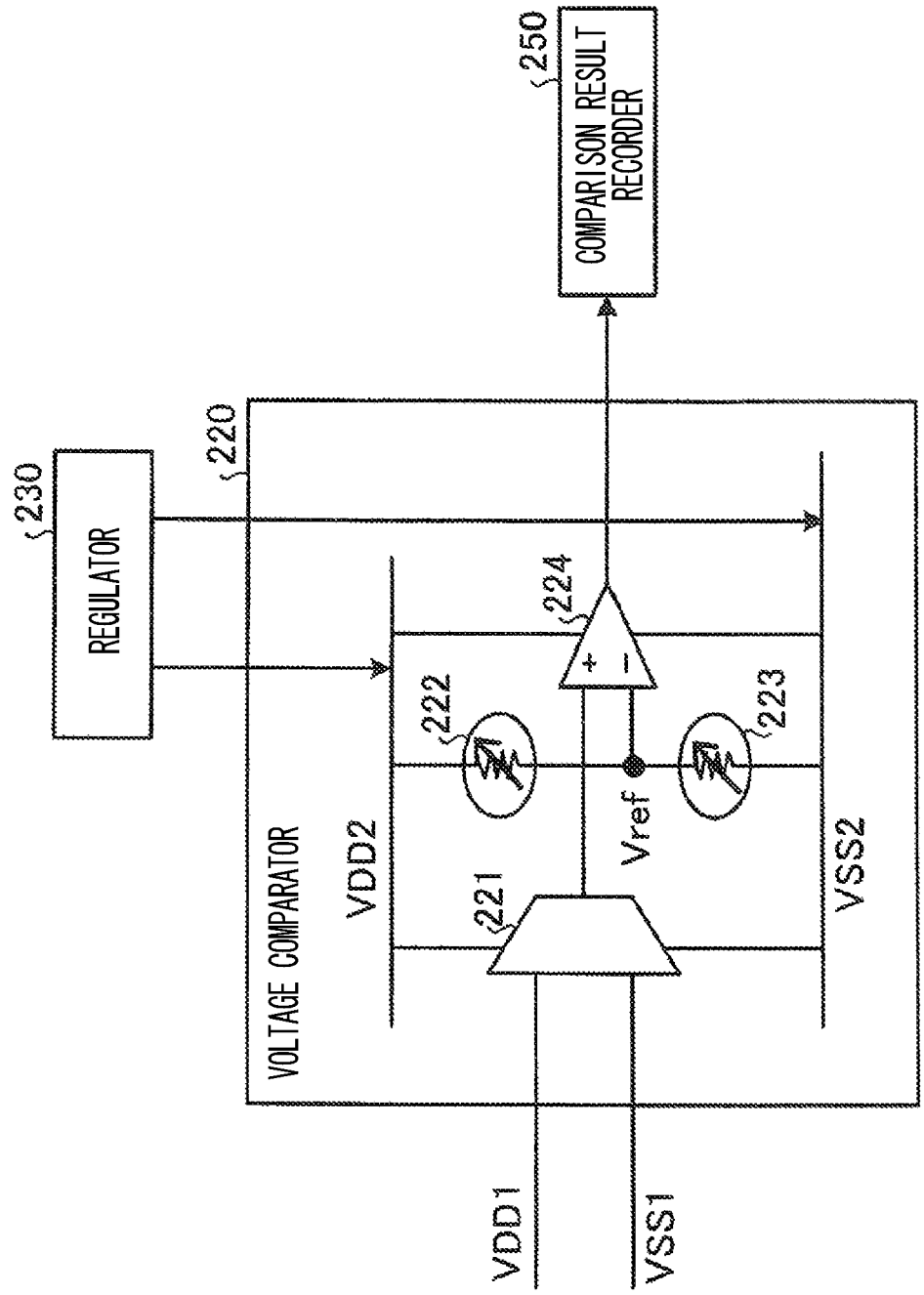
FIG. 2 is a diagram showing a circuit construction of a voltage comparator.

The voltage comparator 220 is supplied with two power sources of VDD2 and VSS2 to be operated. A circuit construction of the voltage comparator 220 is shown in FIG. 2. As shown in FIG. 2, the voltage comparator 220 has a selector 221, variable resistors 222 and 223 and a differential amplifier 224.

The selector 221 selects any one of VDD1 and VSS1, and outputs a selected power source to one differential input of the differential amplifier 224. Provision of the selector as described above makes it unnecessary to prepare a noise observing mechanism for every power source, so that the circuit scale of the semiconductor integrated circuit 200 can be miniaturized.

Variable resistors 222 and 223 are resistors whose resistance values can be arbitrarily set. The variable resistors 222 and 223 are connected to each other in series so that VDD2 and VSS2 are connected to each other through the variable resistors 222 and 223, and thus generate a reference voltage having any voltage value therebetween. The reference voltage generated by the variable resistors 222 and 223 is input to the other differential input of the differential amplifier 224.

States of the selector 221 and the variable resistors 222 and 223 are changed by setting a register for operation test or under the control through an external terminal.

The differential amplifier 224 outputs a high-level signal (High) when the voltage output from the selector 221 is higher than the reference voltage, and outputs a low-level signal (Low) in the other cases. The output of the differential amplifier 224 corresponds to the output of the voltage comparator 220.

VDD2 and VSS2 serving as the power sources with which the respective parts of the voltage comparator 220 operate are temporarily supplied to a regulator 230 as a power supply stabilizing unit through power supply terminals 263 and 264 to be stabilized, and then supplied to the voltage comparator 220. As described above, VDD2 and VSS2 are supplied through a system which is different from that of VDD1 and VSS1 for operating the logic block 210, and further stabilized in the regulator 230. Therefore, the voltage comparator 220 can accurately operate without being affected by the noise occurring in the logic block 210.

Figure 3:
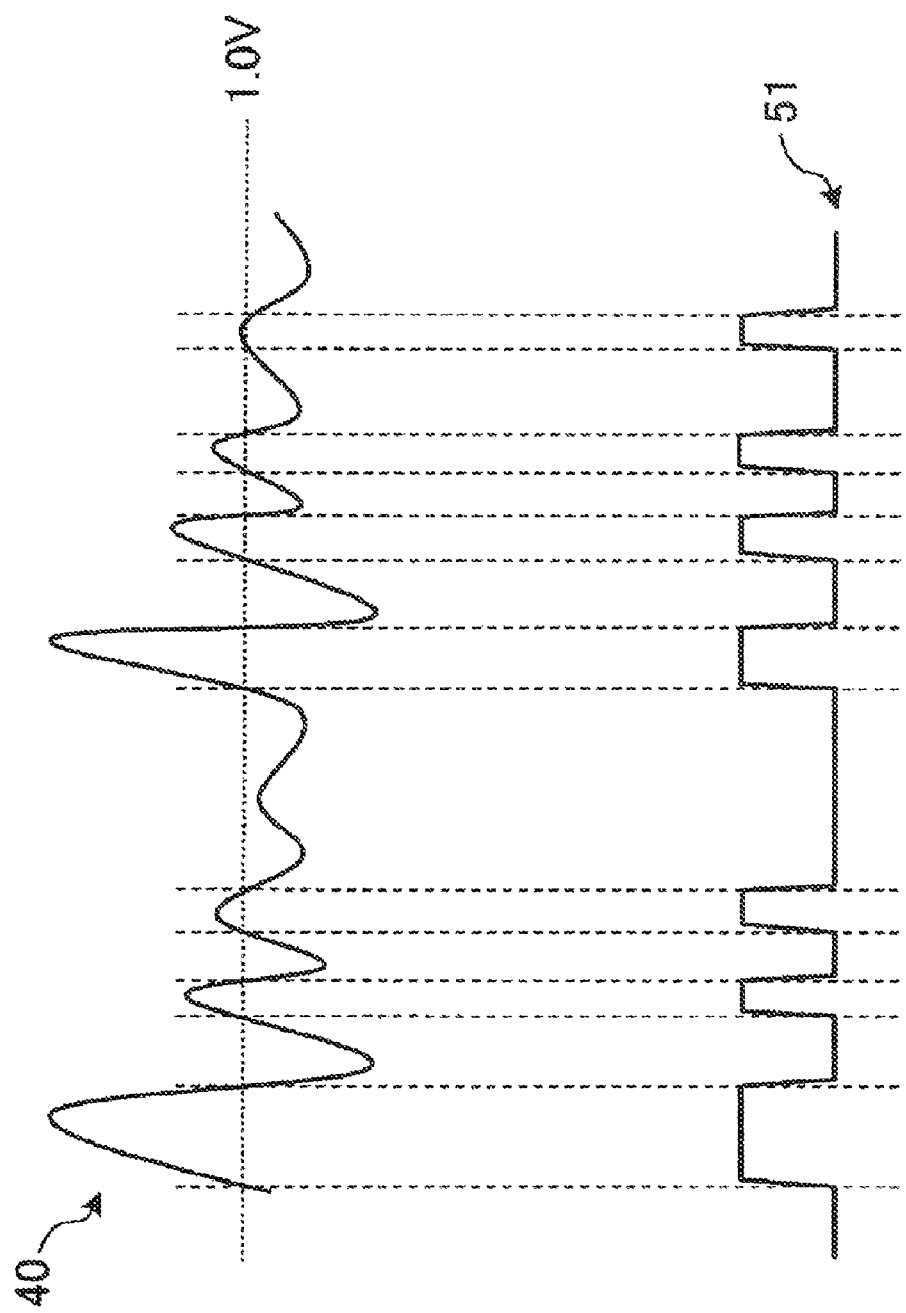
FIG. 3 is a diagram showing an example of an output of the voltage comparator when a reference voltage is set to 1.0 V.
Figure 4:
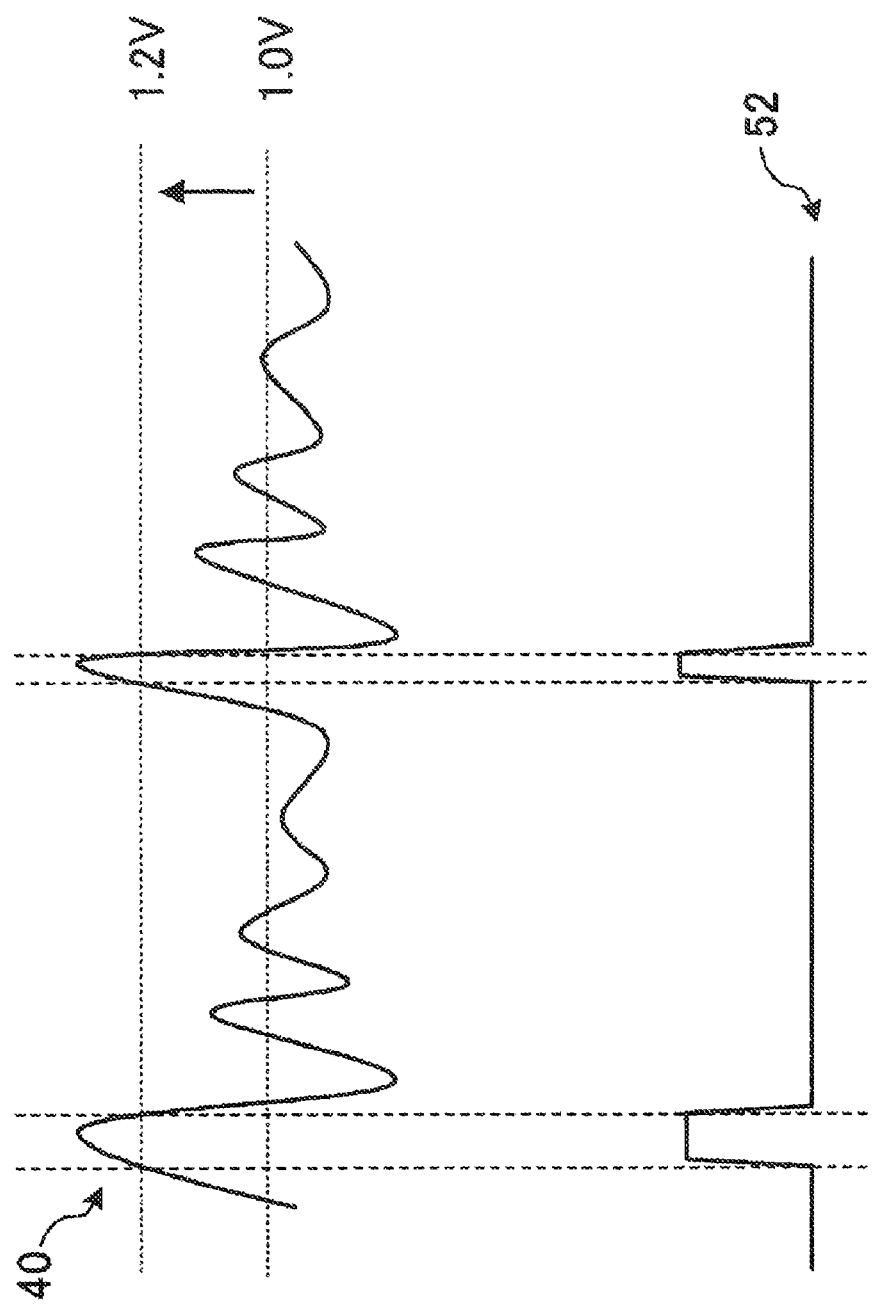
FIG. 4 is a diagram showing an example of an output of the voltage comparator when the reference voltage is set to 1.2 V.

FIGS. 3 and 4 show examples of signals output from the voltage comparator 220. FIG. 3 is a diagram showing an example of an output of the voltage comparator 220 when the reference voltage is set to 1.0 V. A waveform 40 indicates variation of the voltage of VDD1. As shown in FIG. 3, a signal 51 output from the voltage comparator 220 has a rectangular waveform which is set to the high level while the height of the waveform 40 is higher than the reference voltage. Further, the signal 51 is set to the low level while the height of the waveform 40 is equal to the reference voltage or less.

FIG. 4 is a diagram showing an example of the output of the voltage comparator 220 when the reference voltage is increased to 1.2 V. A signal 52 output from the voltage comparator 220 in the case of FIG. 4 is set to the high level for a shorter period as compared with the signal 51. This is because a variation of the voltage as the comparison target exceeds the reference voltage less frequently for a larger reference voltage.

Accordingly, by further increasing the reference voltage and finding out a boundary at which the output of the voltage comparator 220 is not set to the high level, the peak value of the variation of the comparison target voltage, that is, a peak value of the power source noise as the observation target, can be known. The voltage comparator 220 is provided inside the semiconductor integrated circuit 200, and thus the high-frequency power source noise is input to the voltage comparator 220 without being attenuated and is reflected to the output of the voltage comparator 220.

Returning to FIG. 1, the clock controller 240 is a circuit for controlling a clock signal supplied to the comparison result recorder 250. Specifically, the clock controller 240 controls start and stop of transmission of the clock signal, and also expands a pulse width of the clock signal. The clock signal supplied from the clock controller 240 may be input externally through a clock input terminal 265, or generated in the semiconductor integrated circuit 200.

Figure 5:
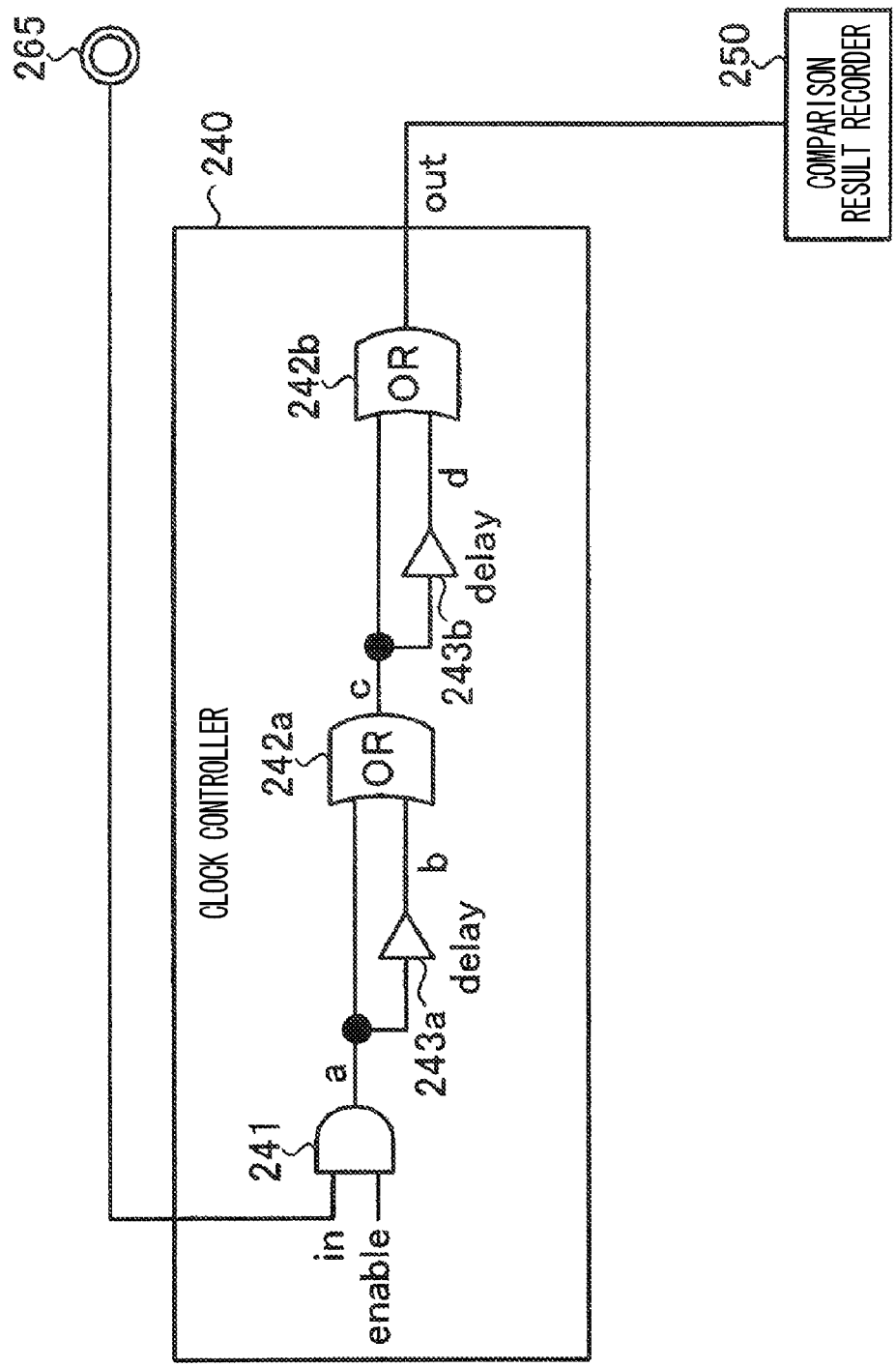
FIG. 5 is a diagram showing a circuit construction of a clock controller.

FIG. 5 is a diagram showing a circuit construction of the clock controller 240. As shown in FIG. 5, the clock controller 240 has an AND circuit 241, OR circuits 242a and 242b, and delay circuits 243a and 243b.

The AND circuit 241 is a circuit for controlling a transmission start and a transmission stop of the clock signal. When an enable signal as one input signal is set to ON, the transmission of the clock signal as the other input signal is started. When the enable signal is set to OFF, the transmission of the clock signal is stopped. The state of the enable signal is changed by setting the register for the operation test or under the control through the external terminal.

When the enable signal is set to ON, the clock signal output from the AND circuit 241 is branched, and one branched clock signal is directly input to the OR circuit 242a. The other branched clock signal is input to the OR circuit 242a through the delay circuit 243a. Then, the clock signal output from the OR circuit 242a is branched again, and one branched clock signal is directly input to the OR circuit 242b while the other branched clock signal is input to the OR circuit 242b through the delay circuit 243b.

Figure 6:
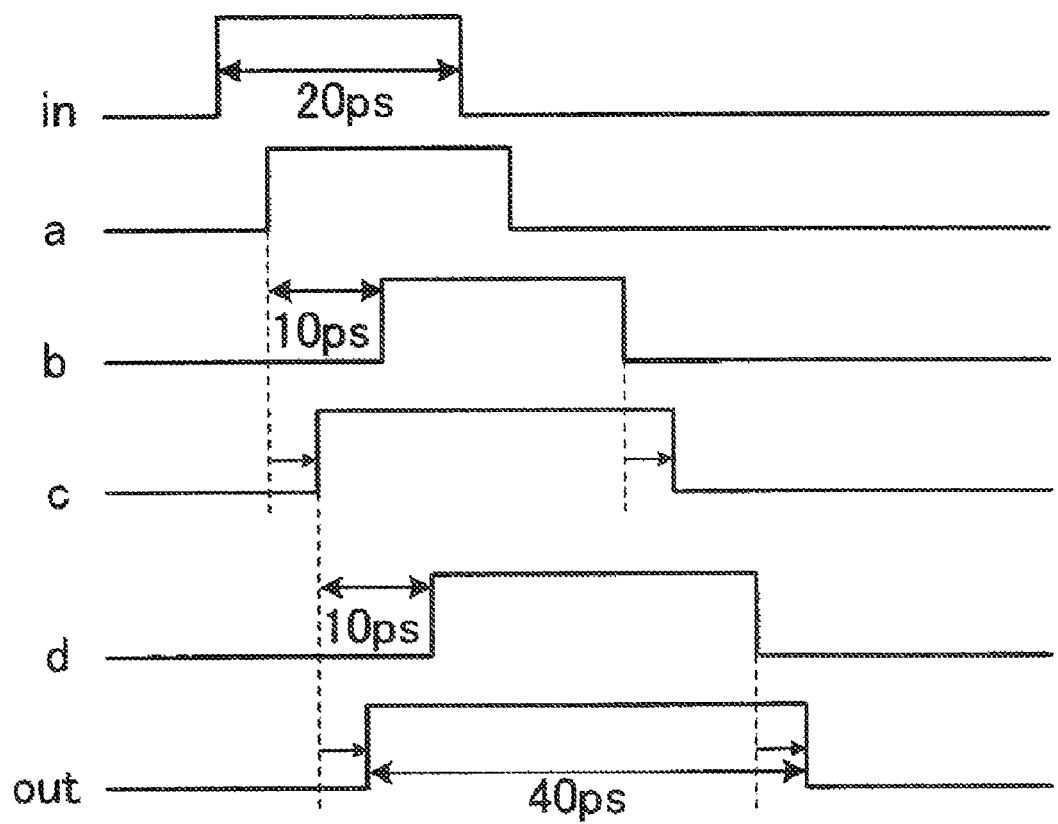
FIG. 6 is a time chart showing an operation of the clock controller.

FIG. 6 is a time chart showing an operation of the clock controller 240. In FIG. 6, a signal "in" is a clock signal input to the AND circuit 241. A signal "a" is a clock signal output from the AND circuit 241. A signal "b" is a clock signal output from the delay circuit 243a. A signal "c" is a clock signal output from the OR circuit 242a. A signal "d" is a clock signal output from the delay circuit 243b. A signal "out" is a clock signal output from the clock controller 240.

It is assumed that a pulse width of the signal "in" is equal to 20 ps (Pico Second) and a delay amount of the delay circuits 243a and 243b is set to 10 ps. In this case, the pulse width of the signals "a" and "b" are also equal to 20 ps. However, the signal "b" is superimposed on the signal "a" in the OR circuit 242a under the state that a delay amount of 10 ps is added in the delay circuit 243a. So that a pulse width of the signal "c" output from the OR circuit 242a is equal to 30 ps.

A pulse width of the signal "d" branched from the signal "c" is also equal to 30 ps. However, the signal "d" is superimposed on the signal "c" in the OR circuit 242b under the state that a delay amount of 10 ps is added in the delay circuit 243b. Thus a pulse width of the signal "out" output from the OR circuit 242b is equal to 40 ps.

As described above, the clock controller 240 branches the clock signal, delays one of the branched signals and then superimposes the delayed branched signal on the other branched signal, thereby expanding the pulse width. In order to record the information concerning the high-frequency noise in the comparison result recorder 250, it is necessary for the clock controller 240 to supply a high-speed clock signal to the comparison result recorder 250. However, the high-speed clock signal has a narrow pulse width, and thus there is a risk that a counter 252 described later, for example, do not operate normally. The clock controller 240 solves this problem by expanding the pulse width.

In the example of FIG. 5, the pulse width is expanded in two steps, that is, in one step at the portion of the delay circuit 243a and the OR circuit 242a and at the other step at the portion of the delay circuit 243b and the OR circuit 242b. However, the pulse width may be expanded in any number of steps. Furthermore, in the example of FIG. 6, the delay amount of the delay circuits 243a and 243b is set to 10 ps, however, the delay amount may be set to any value insofar as it is smaller than the width of the pulse.

Returning to FIG. 1, the comparison result recorder 250 records a comparison result between the power supply voltage and the reference voltage in the voltage comparator 220. Specifically, the comparison result recorder 250 operates a counter by using a waveform output from the voltage comparator 220 as a clock, and makes the counter store a period that the power supply voltage exceeds the reference voltage.

Figure 7:
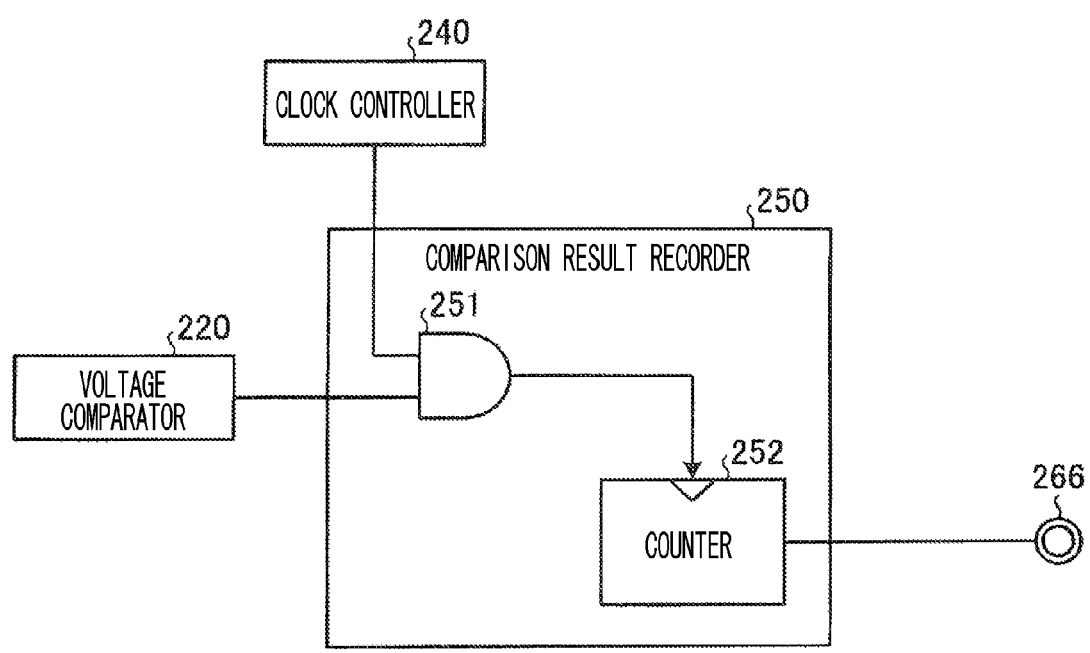
FIG. 7 is a diagram showing a circuit construction of a comparison result recorder.

FIG. 7 is a diagram showing a circuit construction of the comparison result recorder 250. As shown in FIG. 7, the comparison result recorder 250 has an AND circuit 251 and a counter 252. The AND circuit 251 receives the signal output from the voltage comparator 220 (for example, signal 51 in FIG. 3, or signal 52 in FIG. 4) and clock signal supplied from the clock controller 240, and generates a signal for counting up the value of the counter 252 by only a number proportional to a length of the high-level portion of the signal output from the voltage comparator 220.

For example, when a signal in which the high-level state corresponds to a length of seven clocks with respect to the clock signal output from the clock controller 240 is input from the voltage comparator 220 to the AND circuit 251, the AND circuit 251 outputs a signal comprising seven pulses. As described above, the pulse width of the clock signal supplied from the clock controller 240 is expanded, and each pulse output from the AND circuit 251 has the same width as the pulse of the clock signal supplied from the clock controller 240, and thus the counter 252 can be operated with accuracy.

The counter 252 increments its count value by 1 every time the counter 252 receives a pulse output from the AND circuit 251. By the mechanism as described above, the value which is proportional to the total length of the periods when the power supply voltage as an observation target exceeds the reference voltage is set in the counter 252. The value of the counter 252 is read out or reset through the input/output terminal 266 externally.

In order to record the comparison result of the voltage comparator 220, a method of sampling the output of the voltage comparator 220 and time-sequentially recording the sampled data may be considered. In this case, a large storage area is necessary, and thus the circuit scale of the semiconductor integrated circuit 200 is enlarged. On the other hand, if the comparison result of the voltage comparator 220 is recorded by using the counter 252, information which is sufficient to know the occurrence amount of the noise can be recorded in a small storage area.

Next, the procedure of observing power source noise occurring in the semiconductor integrated circuit 200 shown in FIG. 1 will be described. In order to observe the power source noise, the selector 221 is set so that the power source as an observation target is input to the differential amplifier 224, and the variable resistors 222 and 223 are adjusted to set the reference voltage to a predetermined value. After the counter 252 is reset, the enable signal of the clock controller 240 is set to ON for a predetermined time period, to read out the value of the counter 252. As the read-out value is larger, the occurrence amount of noise is larger.

When the peak value of the power source noise is required, the above procedure is repeated while the reference voltage is stepwise increased, and the stage at which the value read out from the counter 252 is equal to zero may be checked.

As described above, according to this embodiment, the mechanism for observing the power source noise is provided in the semiconductor integrated circuit 200. Further, the comparison result between the power supply voltage as the observation target and the reference voltage is not continuously recorded every time axis, but only the length of the period for which it is judged that the power supply voltage exceeds the reference voltage is recorded by the counter 252. Therefore, according to this embodiment, the power supply noise containing the high-frequency component can be observed without enlarging the circuit scale.

Figure 8:
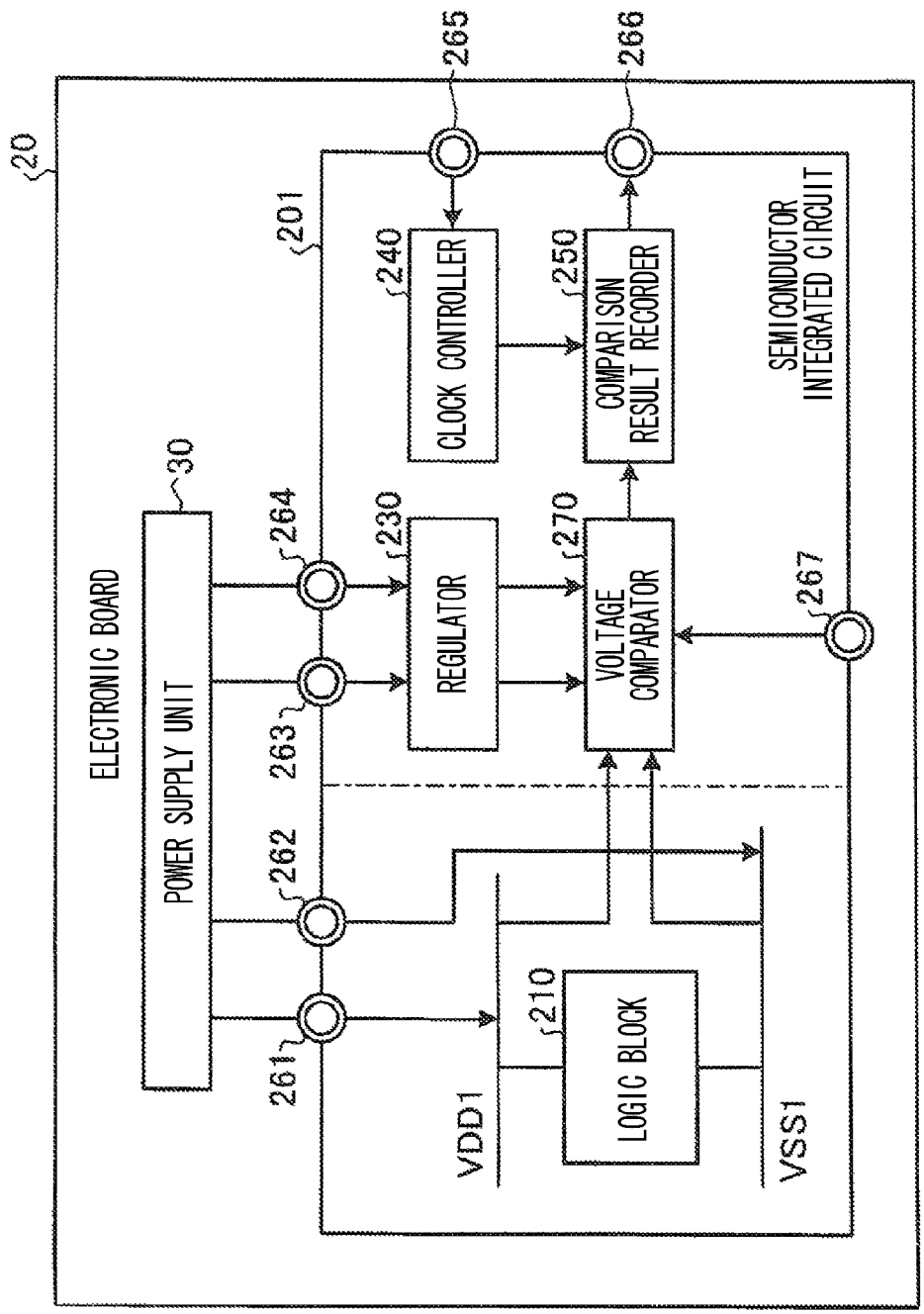
FIG. 8 is a block diagram showing a construction of a semiconductor integrated circuit according to a second embodiment.

In this embodiment, the reference voltage is generated by using the variable resistors. However, the reference power may be supplied from the outside of the semiconductor integrated circuit. A construction of another aspect is shown in FIG. 8. As shown in FIG. 8, a construction of a semiconductor integrated circuit 201 which is supplied with an external reference clock is the same as the semiconductor integrated circuit 200 shown in FIG. 1, except that the voltage comparator 220 is replaced by a voltage comparator 270, and a voltage supply terminal 267 for supplying the reference voltage to the voltage comparator 270 is provided.

Figure 9:
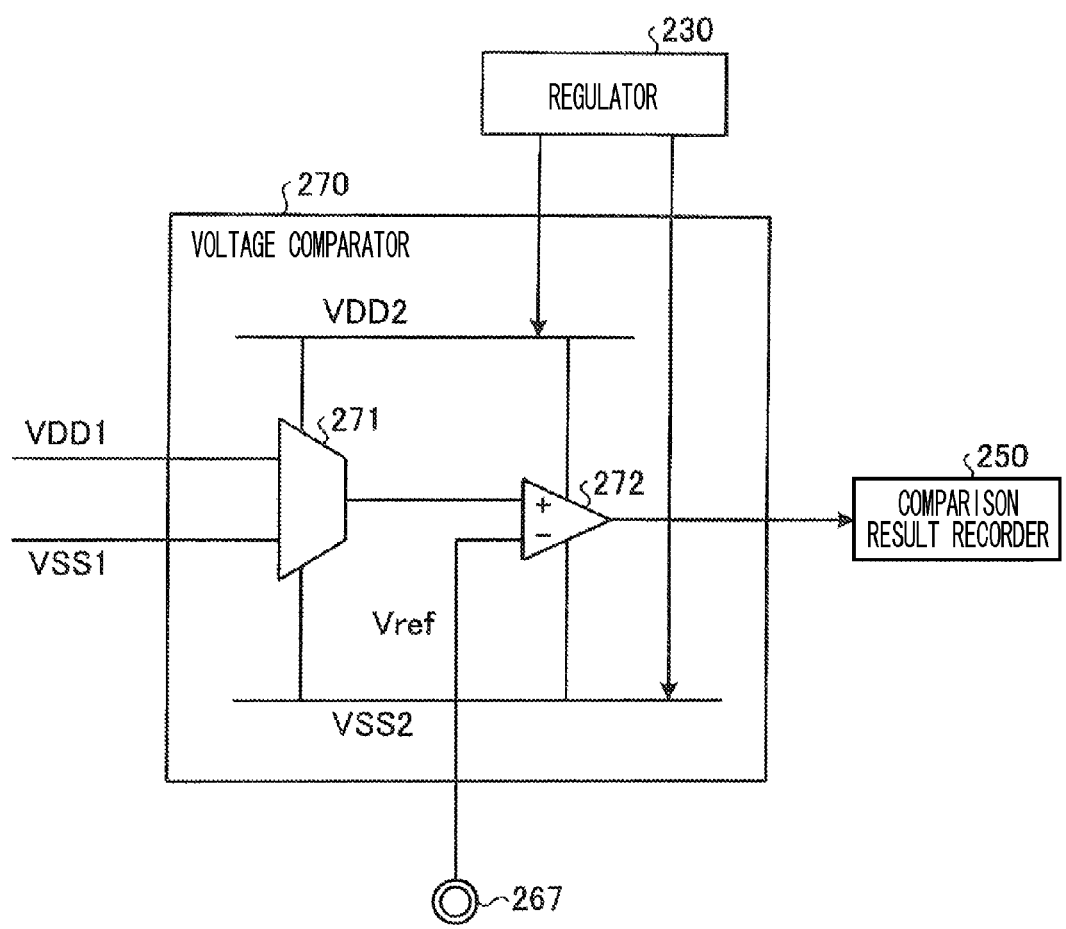
FIG. 9 is a diagram showing a circuit construction of a voltage comparator.

FIG. 9 is a diagram showing a circuit construction of the voltage comparator 270. As shown in FIG. 9, the voltage comparator 270 has a selector 271 and a differential amplifier 272. The selector 271 selects any one of VDD1 and VSS1, and outputs the selected power source to one differential input of the differential amplifier 272. An external reference voltage supplied through the voltage supply terminal 267 is supplied to the other differential input of the differential amplifier 272.

The differential amplifier 272 outputs a high-level signal (High) when the voltage output from the selector 271 is higher than the reference voltage, and outputs a low-level signal (Low) in the other cases. The output of the differential amplifier 272 corresponds to the output of the comparator 270. The other construction and operation are the same as the first embodiment, and thus a detailed description thereof is omitted.

As described above, according to this embodiment, the reference voltage is supplied from the outside of the semiconductor integrated circuit. Therefore, the variable resistors, for example, for generating the reference voltage are not necessary, and thus the circuit scale of the semiconductor integrated circuit can be prevented from being enlarged.

As described above, the semiconductor integrated circuit according to this disclosure is effective in observation of power source noise, and is suitably applied to a case where power source noise containing high-frequency components is required to be observed without enlarging the circuit scale.

According to an aspect of the disclosure, the mechanism for observing the power source noise is provided inside the semiconductor integrated circuit. In addition, the comparison result between the power supply voltage as the observation target and the reference voltage is not continuously recorded every time axis, but only the length of the period for which the power supply voltage is judged as exceeding the reference voltage is recorded. Therefore, the power source noise containing the high frequency component can be observed without enlarging the circuit scale according to an aspect of the disclosure.

According to another aspect of the disclosure, the width of the pulse constituting the clock signal for measuring the length of the period for which the power supply voltage is judged to exceed the reference voltage is expanded. Therefore, even when the speed of the clock signal is increased to observe high-frequency power source noise, the measurement result can be accurately recorded.

Furthermore, according to another aspect of the disclosure, the power source for operating the voltage comparator is supplied from a system different from that of the power source as an observation target. Therefore, the noise observation can be accurately performed without being affected by the noise of the power source as the observation target.

According to another aspect of the disclosure, the power source for operating the voltage comparator is stabilized by the power supply stabilizing unit. Therefore, the noise observation can be accurately performed without being affected by the noise of the power source as the observation target.

Furthermore, according to another aspect of the disclosure, the reference voltage can be changed by the variable resistors. Therefore, by observing the power source noise while the reference voltage is stepwise changed, the peak value of the power source can be checked.

For purposes of explanation, in the above description, numerous specific details are set forth in order to provide a thorough understanding of the disclosure. It will be apparent, however, to one skilled in the art that the disclosure can be practiced without these specific details. In other instances, well-known structures and devices are shown in block diagram form in order to avoid obscuring the disclosure.

While the disclosure has been described in conjunction with the specific embodiments thereof, it is evident that many alternatives, modifications, and variations will be apparent to those skilled in the art. Accordingly, embodiments of the disclosure, as set forth herein, are intended to be illustrative, not limiting. There are changes that may be made without departing from the spirit and scope of the disclosure.

What is claimed is:

1. A semiconductor integrated circuit comprising:
   a first power source that has a power supply voltage for operating the semiconductor integrated circuit;
   a voltage comparator that compares the power supply voltage with a reference voltage;
   a clock controller that expands the width of a pulse of the clock signal without changing the frequency of the clock signal and supplies an expanded clock signal; and
   a comparison result recording unit for recording a comparison result of the voltage comparator, wherein the comparison result recording unit records a length of a period based on the expanded clock signal for which the power supply voltage exceeds the reference voltage.

2. The semiconductor integrated circuit according to claim 1, wherein:
   the clock controller expands the width of a pulse of the clock signal by superimposing a delayed input clock signal on an input clock signal.

3. The semiconductor integrated circuit according to claim 1, wherein the voltage comparator is operated by a second power source, which is different from the first power source and is located in a system different from that of the first power source.

4. The semiconductor integrated circuit according to claim 1, further comprising:
   a power supply stabilizing unit that stabilizes the power supplied to the voltage comparator.

5. The semiconductor integrated circuit according to claim 1, wherein the voltage comparator changes the value of the reference voltage via a variable resistor.

6. The semiconductor integrated circuit according to claim 1, wherein the reference voltage is supplied externally.

7. The semiconductor integrated circuit according to claim 1, wherein the voltage comparator has a selector that selects a power source as a comparison target.

8. A semiconductor integrated circuit comprising:
   a first power source that has a power supply voltage for operating the semiconductor integrated circuit;
   a voltage comparator that compares the power supply voltage with a reference voltage;
   a clock controller that expands the width of a pulse of the clock signal without changing the frequency of the clock signal and supplies an expanded clock signal; and
   a comparison result recording unit for recording a comparison result of the voltage comparator, wherein the comparison result recording unit records a length of a period for which the power supply voltage exceeds the reference voltage while the expanded clock signal inputting to the comparison result recording unit is on.

* * * * *